(12) United States Patent
Choi et al.

(10) Patent No.: US 12,473,662 B2
(45) Date of Patent: Nov. 18, 2025

(54) NANOCRYSTALLINE BORON NITRIDE FILM, IMAGE SENSOR INCLUDING THE SAME, FIELD EFFECT TRANSISTOR INCLUDING THE SAME, AND METHOD OF FABRICATING THE NANOCRYSTALLINE BORON NITRIDE FILM

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Taejin Choi, Suwon-si (KR); Minsu Kim, Ulsan (KR); Hyeonsuk Shin, Ulsan (KR); Hyeonjin Shin, Suwon-si (KR)

(73) Assignees: Samsung Electronics Co., Ltd., Gyeonggi-do (KR); UNIST(ULSAN NATIONAL INSTITUTE OF SCIENCE AND TECHNOLOGY), Ulsan (KR)

(*) Notice: Subject to any disclaimer, the term of this patent is extended or adjusted under 35 U.S.C. 154(b) by 418 days.

(21) Appl. No.: 18/193,058

(22) Filed: Mar. 30, 2023

(65) Prior Publication Data

US 2023/0349072 A1    Nov. 2, 2023

(30) Foreign Application Priority Data

Apr. 27, 2022    (KR) .................... 10-2022-0052235

(51) Int. Cl.
  C30B 29/40    (2006.01)
  C30B 29/60    (2006.01)
  (Continued)

(52) U.S. Cl.
  CPC ............ *C30B 29/40* (2013.01); *C30B 29/605* (2013.01); *H10D 30/6211* (2025.01); *H10F 39/805* (2025.01)

(58) Field of Classification Search
  CPC . C30B 29/40; C30B 29/605; H01L 21/02175; H01L 21/02274; H10D 30/6211; H10F 39/805
  See application file for complete search history.

(56) References Cited

U.S. PATENT DOCUMENTS 5,518,780 A    5/1996    Tamor et al.
9,745,499 B2    8/2017    Hong et al.
(Continued)

FOREIGN PATENT DOCUMENTS

EP    0429993 B1    8/1995
KR    10-0153154 B1    12/1997
(Continued)

OTHER PUBLICATIONS

Extended European Search Report dated Sep. 19, 2023 for corresponding European Application No. 23169701.2.
(Continued)

*Primary Examiner* — Jaehwan Oh
(74) *Attorney, Agent, or Firm* — HARNESS, DICKEY & PIERCE, P.L.C.

(57) ABSTRACT

Disclosed is a nanocrystalline boron nitride film having a relatively low dielectric constant and excellent mechanical properties. The nanocrystalline boron nitride film includes a crystalline boron nitride compound, and has a dielectric constant within a range of 2.5 to 5.5 at a 100 kHz operating frequency.

16 Claims, 17 Drawing Sheets

(51) Int. Cl.
  *H10D 30/62* (2025.01)
  *H10F 39/00* (2025.01)

(56) References Cited

U.S. PATENT DOCUMENTS

| | | | |
|---|---|---|---|
| 12,061,312 B2* | 8/2024 | Choi | H10K 59/8792 |
| 12,080,649 B2* | 9/2024 | Shin | H01L 23/5226 |
| 2004/0058199 A1 | 3/2004 | Sakamoto et al. | |
| 2018/0144930 A1* | 5/2018 | Glavin | H01L 21/02266 |
| 2021/0123161 A1* | 4/2021 | Lee | H01L 21/02293 |
| 2022/0009779 A1 | 1/2022 | Eshon et al. | |
| 2022/0171098 A1* | 6/2022 | Choi | H10K 50/86 |
| 2022/0181151 A1* | 6/2022 | Shin | H01L 21/0337 |

FOREIGN PATENT DOCUMENTS

| | | |
|---|---|---|
| KR | 10-0232922 B1 | 12/1999 |
| KR | 10-0433322 B1 | 6/2004 |
| KR | 10-1528664 B1 | 6/2015 |
| KR | 10-1634160 B1 | 6/2016 |
| KR | 10-1721753 B1 | 3/2017 |
| KR | 10-2202991 B1 | 1/2021 |
| KR | 10-2021-0052162 A | 5/2021 |
| KR | 10-2021-0091775 A | 7/2021 |
| KR | 10-2021-0137641 A | 11/2021 |
| KR | 10-2022-0076179 A | 6/2022 |
| KR | 10-2022-0078281 A | 6/2022 |
| WO | WO-2014/182540 A1 | 11/2014 |

OTHER PUBLICATIONS

Roland Yingjie Tay et al. "Direct growth of nanocrystalline hexagonal boron nitride films on dielectric substrates," Appl. Phys. Lett. 106, 2015, pp. 101901-1-101901-5.

Zheng Zhuoyuan et al. "Surface modification of hexagonal boron nitride nanomaterials: a review," Journal of Material Science, Kluwer Academic Publishers, Dordrecht, vol. 53, No. 1, (Aug. 23, 2017), pp. 66-99, XP036337756.

L. Loureiro da Silva et al., "Magnetic Multilayers in $Ga_{1-x}Mn_xAs$/GaAs Structure," Brazilian Journal of Physics, vol. 32, No. 2A, Jun. 2002, pp. 433-435.

Roland Yingjie Tay et al. "Direct growth of nanocrystalline hexagonal boron nitride films on dielectric substrates," Applied Physics Letters, 106, 101901 (2015).

Ghassan Younes et al. "Growth of Nanocrystalline Translucent h-BN Films Deposited by CVD at High Temperature on SiC Substrates," Materials Science Forum vol. 645-648 (2010) pp. 1191-1194.

I. Montero et al. "Structural Properties of BN Thin Films obtained by PECVD," Surface and Interface Analysis, vol. 21, (1994), pp. 809-813.

Katsumitsu Nakamura, "Preparation and Properties of Amorphous Boron Nitride Films by Molecular Flow Chemical Vapor Deposition," J. Electrochem. Soc., Solid-State Science and Technology, vol. 132, No. 7, Jul. 1985, pp. 1757-1762.

T.P. Smirnova et al. "Boron nitride films prepared by remote plasma-enhanced chemical vapour deposition from borazine (B3N3H6)"Thin Solid Films, 237, (1994), pp. 32-37.

Nicholas R. Glavin et al. "Amorphous Boron Nitride A Universal, Ultrathin Dielectric For 2D Nanoelectronics" Advaned Functional Materials, 2016, 26, pp. 2640-2647.

Jun-Sheng Li et al. "Boron nitride coatings by chemical vapor deposition from borazine" Surface & Coatings Technology, 205, (2011), pp. 3736-3741.

Seokmo Hong et al. "Ultralow-dielectric constant amorphous boron nitride" Nature, vol. 582, Jun. 25, 2020, 511-514, pp. 1-16.

* cited by examiner

FIG. 2

|  | GROWTH TEMPERATURE (°C) | PLASMA POWER (W) | DIELECTRIC CONSTANT | CRYSTAL |
|---|---|---|---|---|
| COMPARATIVE EXAMPLE | 200 | 20 | <2.5 | AMORPHOUS |
| EMBODIMENT 1 | 400 | 20 | >3.3 | NANO |
| EMBODIMENT 2 | 600 | 20 | >3.8 | NANO |
| EMBODIMENT 3 | 200 | 60 | >2.5 | NANO |
| EMBODIMENT 4 | 300,350 | 60 | >3.2 | NANO |
| EMBODIMENT 5 | 400 | 60 | >3.5 | NANO |

| EMBODIMENT 5 | DIELECTRIC CONSTANT | Hardness | Modulus |
|---|---|---|---|
| THICKNESS | 100kHz | GPa | GPa |
| 300nm | 5.5 | 3.309 | 50.16 |
| 100nm | 3.9 | 2.465 | 42.84 |
| 35nm | 3.5 | N/A | N/A |

NANOCRYSTALLINE BORON NITRIDE FILM, IMAGE SENSOR INCLUDING THE SAME, FIELD EFFECT TRANSISTOR INCLUDING THE SAME, AND METHOD OF FABRICATING THE NANOCRYSTALLINE BORON NITRIDE FILM

CROSS-REFERENCE TO RELATED APPLICATION

This application claims the benefit of Korean Patent Application No. 10-2022-0052235, filed on Apr. 27, 2022 in the Korean Intellectual Property Office, the disclosure of which is incorporated herein in its entirety by reference.

BACKGROUND

1. Field

The disclosure relates to a nanocrystalline boron nitride film, an image sensor including the nanocrystalline boron nitride film, an electric field effect transistor including the nanocrystalline boron nitride film, and a method of fabricating the nanocrystalline boron nitride film.

2. Description of Related Art

Integrated circuits of various electronic apparatuses including display devices, image sensors, electric field effect transistors, memory devices, and the like may be mostly fabricated by combining and connecting a semiconductor, a conductor, and an insulator. For example, the integrated circuits of various electronic apparatuses may be formed by a method of forming a plurality of unit devices on a substrate and then stacking interlayer insulating layers and wirings thereon.

As the density of integrated circuits may increase significantly, an interval between conductor patterns may gradually decreased. Accordingly, parasitic capacitance between conductor patterns may increase, and thus, the performance of an electronic apparatus may be degraded. For example, the parasitic capacitance may delay the transfer of signals of semiconductor devices. To reduce the parasitic capacitance, insulator materials having relatively low dielectric constant have been suggested as interlayer insulating films.

SUMMARY

Provided is a nanocrystalline boron nitride film having a relatively low dielectric constant and excellent mechanical properties.

Provided is an image sensor including the nanocrystalline boron nitride film.

Provided is an electric field effect transistor including the nanocrystalline boron nitride film.

Provided is a method of fabricating the nanocrystalline boron nitride film.

Additional aspects will be set forth in part in the description which follows and, in part, will be apparent from the description, or may be learned by practice of the presented embodiments.

According to an embodiment, a nanocrystalline boron nitride film may include a crystalline boron nitride compound, and may have a dielectric constant within a range of 2.5 to 5.5 at a 100 kHz operating frequency.

In some embodiments, the nanocrystalline boron nitride film may include a plurality of nanocrystalline boron nitride crystals that may be randomly oriented.

In some embodiments, the plurality of nanocrystalline boron nitride crystals may have a size within a range of 5 nm to 100 nm.

In some embodiments, the nanocrystalline boron nitride film may have a Young's modulus of 8 GPa to 100 GPa.

In some embodiments, the nanocrystalline boron nitride film may have a Young's modulus of 10 GPa to 60 GPa.

In some embodiments, the nanocrystalline boron nitride film may have a hardness of 1 GPa to 10 GPa.

In some embodiments, the nanocrystalline boron nitride film may have a hardness of 2 GPa to 5 GPa.

In some embodiments, the nanocrystalline boron nitride film may have an absorption peak within a range of 1350 $cm^{-1}$ to 1380 $cm^{-1}$ of a Raman spectrum.

In some embodiments, the nanocrystalline boron nitride film may include an $sp^3$ hybridized bond and an $sp^2$ hybridized bond, and a ratio of the $sp^3$ hybridized bond hybridized bond in the nanocrystalline boron nitride film may be less than 20%.

In some embodiments, a hydrogen content in the nanocrystalline boron nitride film may be less than 10 at %.

According to an embodiment, an image sensor may include a substrate, a plurality of photodiodes on the substrate, and a nanocrystalline boron nitride film on the plurality of photodiodes, wherein the nanocrystalline boron nitride film may include a crystalline boron nitride compound, and the nanocrystalline boron nitride film may have a dielectric constant within a range of 2.5 to 5.5 at a 100 kHz operating frequency.

According to an embodiment, an electric field effect transistor may include a source, a drain, a channel between the source and the drain, a gate disposed to face the channel, a gate insulating film disposed between the gate and the channel, and a spacer disposed between the source and the gate and between the drain and the gate, wherein the spacer may include a crystalline boron nitride compound in a nanocrystalline boron nitride film, and the nanocrystalline boron nitride film may have a dielectric constant within a range of 2.5 to 5.5 at a 100 kHz operating frequency.

According to an embodiment, a method of fabricating a nanocrystalline boron nitride film may include preparing a substrate, and growing a nanocrystalline boron nitride film on the substrate using a plasma from a reactive gas including a boron nitride source at a temperature of 200° C. to 800° C. The nanocrystalline boron nitride film may include a crystalline boron nitride compound, and the nanocrystalline boron nitride film may have a dielectric constant within a range of 2.5 to 5.5 at a 100 kHz operating frequency.

In some embodiments, the preparing of the substrate may include cleaning the substrate, and performing an $H_2$ plasma process on a surface of the substrate at a temperature of 200° C. to 800° C.

In some embodiments, the $H_2$ plasma process on the surface of the substrate may be performed using a flow rate of $H_2$ at 20 sccm to 200 sccm and a plasma power of 20 W to 100 W.

In some embodiments, the growing of the nanocrystalline boron nitride film on the substrate may be performed while maintaining an $H_2$ plasma state and controlling a reactive gas including a boron nitride source at 0.03 sccm to 1 sccm.

According to an embodiment, a semiconductor structure may include a substrate and a nanocrystalline boron nitride structure on the semiconductor substrate. The nanocrystalline boron nitride structure may include a crystalline boron nitride compound. The nanocrystalline boron nitride film may have a dielectric constant within a range of 2.5 to 5.5 at a 100 kHz operating frequency.

In some embodiments, the semiconductor structure may include a first material layer between the substrate and the nanocrystalline boron nitride structure; and a second material layer between the first material layer and the nanocrystalline boron nitride structure. The first material layer, the second material layer, and the nanocrystalline boron nitride structure may be stacked on each other to provide an anti-reflective coating structure. The nanocrystalline boron nitride structure may be a nanocrystalline boron nitride film covering the second material layer. A refractive index of the first material layer may be greater than a refractive index of the second material layer. The refractive index of the second material layer may be greater than the refractive index of the nanocrystalline boron nitride film, and In some embodiments, the semiconductor structure may include a photoresist layer on the substrate. The nanocrystalline boron nitride structure may be a nanocrystalline boron nitride film between the substrate and the photoresist layer, and the photoresist layer may be on nanocrystalline boron nitride film.

In some embodiments, the nanocrystalline boron nitride structure may be a nanocrystalline boron nitride film. The substrate may be a transparent substrate. The nanocrystalline boron nitride film may be spaced apart from the transparent substrate. The transparent substrate may be on a light absorption layer of a solar cell or the transparent substrate may be on a display panel.

In some embodiments, the semiconductor structure may further include a conductive wiring on the substrate; and a dielectric layer on the substrate. The dielectric layer may include a trench. The conductive wiring may be in the trench. The nanocrystalline boron nitride structure may be a diffusion barrier layer in the trench between the conductive wiring and the dielectric layer. The diffusion barrier layer may cover a side surface of the conductive wiring and a lower surface of the conductive wiring.

BRIEF DESCRIPTION OF THE DRAWINGS

These and/or other aspects will become apparent and more readily appreciated from the following description of the embodiments, taken in conjunction with the accompanying drawings in which:

FIG. 2 is a table showing the process conditions of a comparative example and various embodiments and the dielectric constant of a boron nitride film according thereto;

DETAILED DESCRIPTION

Figure 1A:
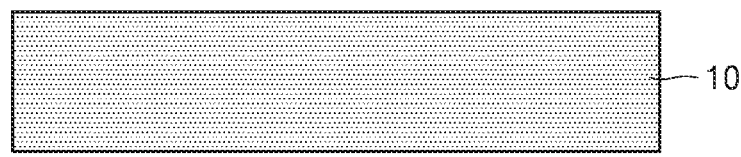
FIGS. 1A to 1C are cross-sectional views schematically showing a method of forming a nanocrystalline boron nitride film.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a semiconductor device including a junction of metal—two-dimensional material—semiconductor is described in detail with reference to the accompanying drawings. Throughout the drawings, like reference numerals denote like elements, and sizes of components in the drawings may be exaggerated for convenience of explanation and clarity. Furthermore, as embodiments described below are examples, other modifications may be produced from the embodiments.

In the following description, when a constituent element is disposed "above" or "on" to another constituent element, the constituent element may be only directly on the other constituent element or above the other constituent elements in a non-contact manner. The expression of singularity in the specification includes the expression of plurality unless clearly specified otherwise in context. Also, when a part may "include" a certain constituent element, unless specified otherwise, it may not be construed to exclude another constituent element but may be construed to further include other constituent elements.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as " . . . portion," " . . . unit," " . . . module," and " . . . block" stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure unless otherwise claimed.

Figure 1B:
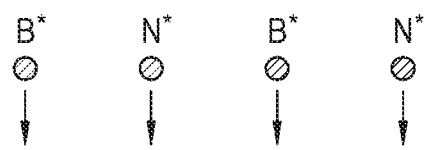
Figure 1B:
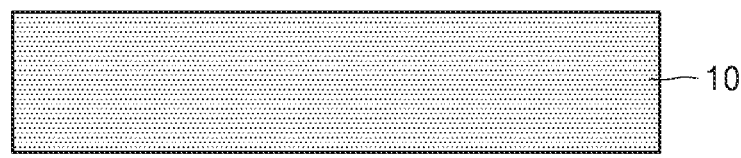
Figure 1C:
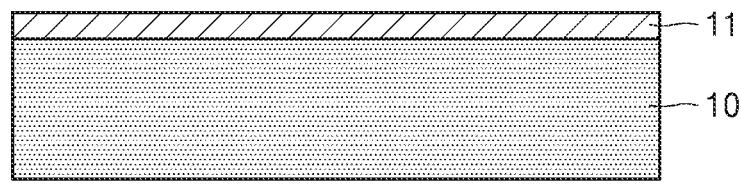

FIGS. 1A to 1C are cross-sectional views schematically showing a method of forming a nanocrystalline boron nitride film.

First, referring to FIG. 1A, a substrate 10 is prepared inside a chamber (not shown). Although FIG. 1A illustrates the substrate 10 only, an intermediate structure of an integrated circuit may be present on the substrate 10, and a nanocrystalline boron nitride film is to be formed in the intermediate structure. For example, the substrate 10 may include an intermediate structure to manufacture various electronic apparatuses, such as image sensors, display devices, electric field effect transistors, solar cells, display devices, and the like.

Alternatively, the substrate 10 may be a growth substrate to form a nanocrystalline boron nitride film. In this case, the substrate 10 may include at least one of, for example, a semiconductor material, an insulating material, and a metal material. A semiconductor material may include a group IV semiconductor or a compound semiconductor. The group IV semiconductor may include, for example, Si, Ge, Sn, or the like, but the disclosure is not limited thereto. The compound semiconductor may include, for example, a semiconductor material obtained by combining at least two of Si, Ge, C, Zn, Cd, Al, Ga, in, B, C, N, P, S, Se, As, Sb, and Te, a group III-V compound semiconductor, and the like. The insulating material may include at least one of, for example, an oxide, a nitride, and a carbide of at least one of Si, Ni, Al, W, Ru, Co, Mn, Ti, Ta, Au, Hf, Zr, Zn, Y, Cr, Cu, Mo, and Gd, and a derivative thereof.

The substrate 10 may be pre-treated before the substrate 10 is disposed inside the chamber. For example, the substrate 10 may be immersed in an organic solvent, such as acetone, ultrasound-processed, and then, cleaned with isopropenyl alcohol (IPA) and a nitrogen gas. Furthermore, the substrate 10 may be immersed in an HF solution to remove a natural oxide, and a residual HF solution may be removed by using anhydrous ethanol and a nitrogen gas.

The substrate 10 that has been cleaned is prepared inside the chamber, and then, by performing a plasma process on a surface of the substrate 10 inside the chamber, carbon impurities remaining on the surface of the substrate 10 may be removed. For example, at a temperature of about 200° C. to about 800° C., the surface of the substrate 10 may undergo an $H_2$ plasma process. During the $H_2$ plasma process of the surface of the substrate 10, a flow rate of $H_2$ may be controlled to be about 20 standard cubic centimeters (sccm) to about 200 sccm and plasma power may be maintained at about 20 W to about 100 W, or about 30 W to about 100 W.

A process pressure to grow a nanocrystalline boron nitride film may be about 10 mTorr or more. For example, the process pressure to grow a nanocrystalline boron nitride film may be within a range of about 10 mTorr to about 1 Torr.

Next, while maintaining an $H_2$ plasma state, a reactive gas to grow a nanocrystalline boron nitride film is injected into the inside of the chamber. The reactive gas may include a boron nitride source for the growth of a nanocrystalline boron nitride film. The boron nitride source may be a source including both of nitrogen and boron, for example, borazine ($B_3N_3H_6$), ammonia-borane ($NH_3$—$BH_3$), or the like. Furthermore, the boron nitride source may include a nitrogen source including nitrogen and a boron source including boron. The nitrogen source may include, for example, at least one of ammonia ($NH_3$) and nitrogen ($N_2$), and the boron source may include at least one of $BH_3$, $BF_3$, $BCl_3$, $B_2H_6$, $(CH_3)_3B$, and $(CH_3CH_2)_3B$.

The reactive gas may further include a carrier gas. The carrier gas may include an inert gas. The inert gas may include at least one of, for example, an argon gas, a neon gas, a nitrogen gas, a helium gas, a krypton gas, and a xenon gas. Furthermore, the reactive gas may further include hydrogen gas to promote activation by plasma. FIG. 1A illustrates an example of using borazine ($B_3N_3H_6$) as a boron nitride source and a nitrogen gas as a carrier gas.

The mixing rate of a reactive gas injected into the inside of the chamber may be regulated by controlling flow rates of a source for boron nitride, an inert gas, and a hydrogen gas, which are injected into the chamber. To form a nanocrystalline boron nitride film, it is necessary that the content of a source for boron nitride is relatively small in the reactive gas, and to this end, the flow rate of the source for boron nitride injected into the chamber may be relatively low. For example, the flow rate of the source for boron nitride may be selected within a range of about 0.03 sccm to about 1 sccm.

During the injection of the reactive gas into the chamber, the plasma power may be maintained within a range of about 20 W to about 100 W, or about 30 W to about 100 W, and the process temperature may be maintained within about 200° C. to about 800° C. A plasma device may be a device for providing plasma including inductively coupled plasma, microwave plasma, capacitively coupled discharge plasma, electron cyclotron resonance plasma, helicon plasma, and the like, but the disclosure is not limited thereto. When an electric field is induced inside the chamber, plasma for the growth of a nanocrystalline boron nitride film may be generated by the induced electric field.

Referring to FIG. 1B, the plasma of the reactive gas may be a mixture of the boron nitride source, the carrier gas, and the hydrogen gas. The plasma of the reactive gas may activate nitrogen atoms and boron atoms, and nitrogen atoms (N*) and boron atoms (B*) that are activated may be adsorbed to the surface of the substrate 10. As the plasma of a carrier gas continuously induces the activation of the substrate 10, the adsorption of activated nitrogen (N*) and activated boron (B*) to the surface of the substrate 10 may be accelerated.

Referring to FIG. 1C, with the acceleration of the adsorption of the activated nitrogen (N*) and the activated boron (B*) to the surface of the substrate 10, a nanocrystalline boron nitride film 11 may grow from the surface of the substrate 10. The nanocrystalline boron nitride film 11 formed as above may include a crystalline boron nitride compound. In particular, the nanocrystalline boron nitride film 11 may include nanocrystalline boron nitride (nc-BN).

The nanocrystalline boron nitride film 11 formed on the substrate 10 may be separated from the substrate 10 and transferred to another substrate or device. Alternatively, the nanocrystalline boron nitride film 11 may be grown directly from an intermediate structure to manufacture various electronic apparatuses, such as image sensors, display devices, electric field effect transistors, solar cells, display devices, and the like.

The nanocrystalline boron nitride film formed by the method described above may include a hexagonal boron nitride film (h-BN) and/or a cubic boron nitride film (c-BN). The hexagonal boron nitride film may have a nanocrystalline structure having an $sp^2$ hybridized bond. The cubic boron nitride film may have a nanocrystalline structure having an $sp^3$ hybridized bond. The nanocrystalline boron nitride film may be a crystalline boron nitride film having a nano-scaled crystal size (for example, 100 nm or less). For example, the nanocrystalline boron nitride film may have a crystal having a size of about 5 nm to about 100 nm. Alternatively, the nanocrystalline boron nitride film may have a crystal having a size of about 5 nm to about 50 nm, about 5 nm to about 20 nm, or about 5 nm to about 10 nm. In the nanocrystalline boron nitride film, a portion taken by the $sp^3$ hybridized bond may be less than, for example, about 20%. The portion of the $sp^3$ hybridized bond may be measured through, for example, X-ray photoelectron spectroscopy (XPS) analysis.

In the nanocrystalline boron nitride film, a content ratio of boron to nitrogen may be, for example, about 0.5 to about 2.0. Alternatively, in the nanocrystalline boron nitride film, the content ratio of boron to nitrogen may be about 0.9 to about 1.1. Furthermore, the nanocrystalline boron nitride film may further include hydrogen, and in this case, a hydrogen content in the nanocrystalline boron nitride film may be less than, for example, about 10 at %.

The nanocrystalline boron nitride film may have a relatively low dielectric constant. For example, the nanocrystalline boron nitride film may have a dielectric constant with a range of about 2.5 to about 5.5 at an operating frequency of 100 kHz. Accordingly, the nanocrystalline boron nitride film may be used as an interlayer insulating film, a spacer, a device separation film, and the like, which need a low dielectric constant, in the integrated circuit of various electronic apparatuses, so that parasitic capacitance between conductor patterns may be reduced.

Furthermore, the nanocrystalline boron nitride film may have a Young's modulus within a range of about 8 GPa to about 100 GPa. Alternatively, the nanocrystalline boron nitride film may have a Young's modulus within a range of about 10 GPa to about 60 GPa. Furthermore, the nanocrystalline boron nitride film may have a hardness within a range of about 1 GPa to about 10 GPa. The hardness of the nanocrystalline boron nitride film may be obtained using the instrumented indentation test. Alternatively, the nanocrystalline boron nitride film may have a hardness within a range of about 2 GPa to about 5 GPa. Accordingly, as the nanocrystalline boron nitride film has excellent mechanical physical properties, such as hardness or Young's modulus, even when the nanocrystalline boron nitride film is formed to a thin thickness, the nanocrystalline boron nitride film may have physically/mechanically stable properties.

In the process of forming the nanocrystalline boron nitride film described above, by changing process conditions, for example, a process temperature, plasma power, and the like, the physical properties of nanocrystalline boron nitride film may be slightly changed. Alternatively, an amorphous boron nitride film may be formed depending on the process conditions. For example, FIG. 2 is a table showing the process conditions of a comparative example and various embodiments and the dielectric constant of a boron nitride film according thereto. Referring to FIG. 2, when both of a process temperature and plasma power are low, an amorphous boron nitride film may be formed. For example, when a process temperature is 200° C. and plasma power is 20 W, an amorphous boron nitride film may be formed. In contrast, when a process temperature is higher than 200° C. or a plasma power is higher than 20 W, a nanocrystalline boron nitride film may be formed. In other words, to form a nanocrystalline boron nitride film, at least one condition of a process temperature higher than 200° C. and plasma power greater than 20 W is satisfied. As a process temperature increases or plasma power increases, the crystal size and dielectric constant of a nanocrystalline boron nitride film may increase. Dielectric constant is calculated through capacitance-voltage sweep measurement by depositing a boron nitride film on an over-doped silicon substrate and a copper (Cu) electrode on the boron nitride film to form a metal-insulator-metal (MIM) capacitor.

The formation of a nanocrystalline boron nitride film may be checked by various methods. For example, the formation of a nanocrystalline boron nitride film may be checked through Fourier-transform infrared spectroscopy (FT-IR) spectrum analysis, XPS component analysis, a transmission electron microscope (TEM) image, and the like. Also, the formation of a nanocrystalline boron nitride film may be checked through Raman spectrum analysis.

Figure 3:
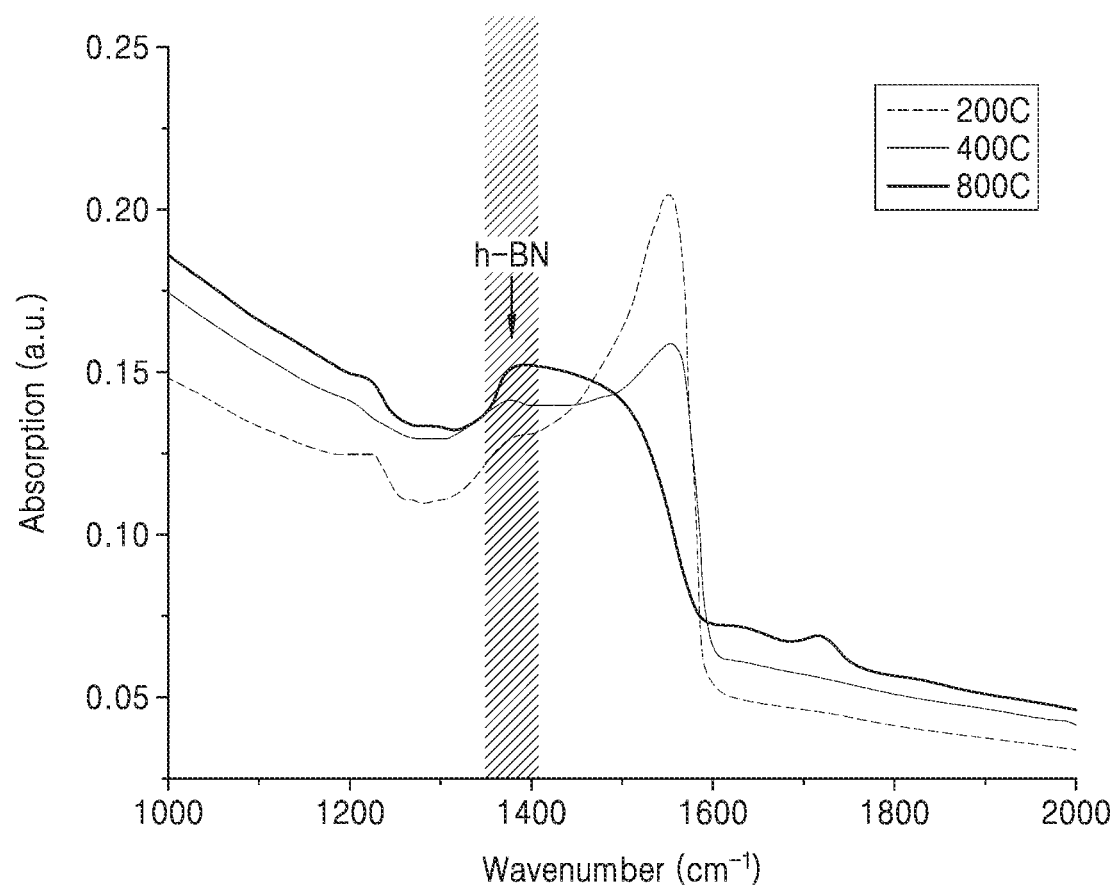
FIG. 3 is a graph showing an analysis result of Fourier-transform infrared spectroscopy (FT-IR) spectrums of boron nitride films fabricated at various temperatures.

For example, FIG. 3 is a graph showing an analysis result of FT-IR spectrums of boron nitride films fabricated at various temperatures. FIG. 3 illustrates FT-IR spectrums measured using s-polarization at an incident angle of 60°. Referring to FIG. 3, an absorption band by a B=N crystalline bond may be checked between 1400 cm$^{-1}$ and 1600 cm$^{-1}$, in particular around 1400 cm$^{-1}$. Furthermore, it may be checked that, as a process temperature increases, an absorption peak increases.

Figure 4:
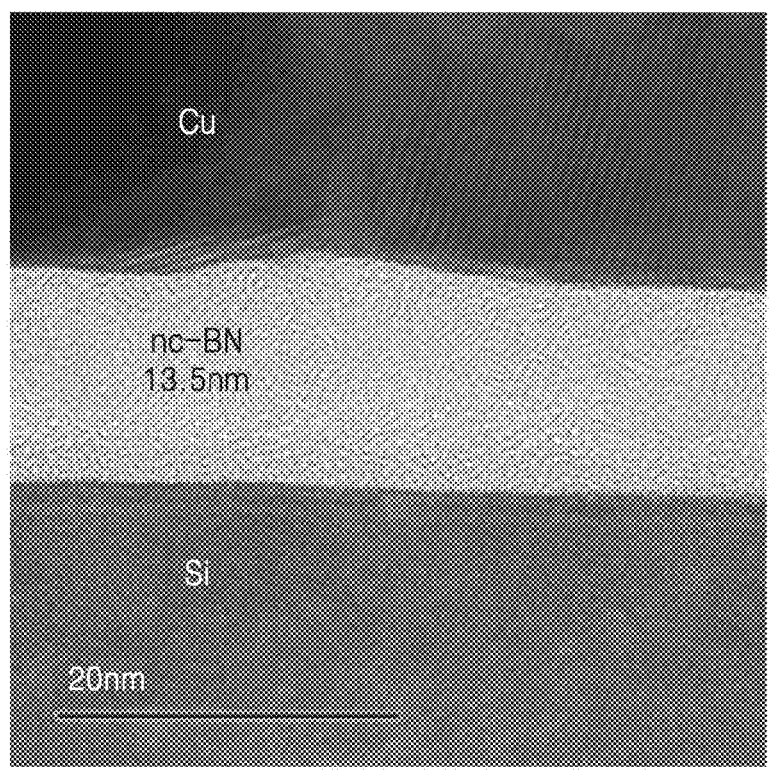
FIG. 4 is a transmission electron microscope (TEM) image of a nanocrystalline boron nitride film fabricated according to an embodiment.

FIG. 4 is a TEM image of a nanocrystalline boron nitride film fabricated according to an embodiment. Referring to FIG. 4, it may be checked that a nanocrystalline boron nitride film is formed on a silicon substrate in a thickness of 13.5 nm. The nanocrystalline boron nitride film of FIG. 4 is formed under the process conditions of Embodiment 3 of FIG. 2. The dielectric constant and crystal size of the nanocrystalline boron nitride film of FIG. 4 are about 2.6 and about 10 nm or less, respectively. Furthermore, it may be checked that, in the nanocrystalline boron nitride film of FIG. 4, a plurality of nanocrystalline boron nitride crystals are randomly oriented.

Figure 5:
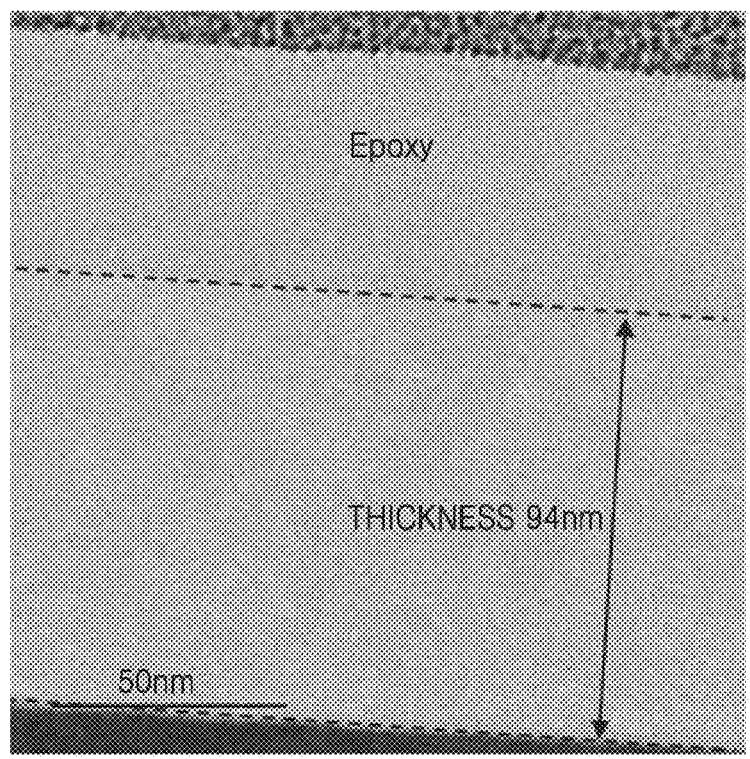
FIG. 5 is a TEM image of a nanocrystalline boron nitride film fabricated according to an embodiment.
Figure 6:
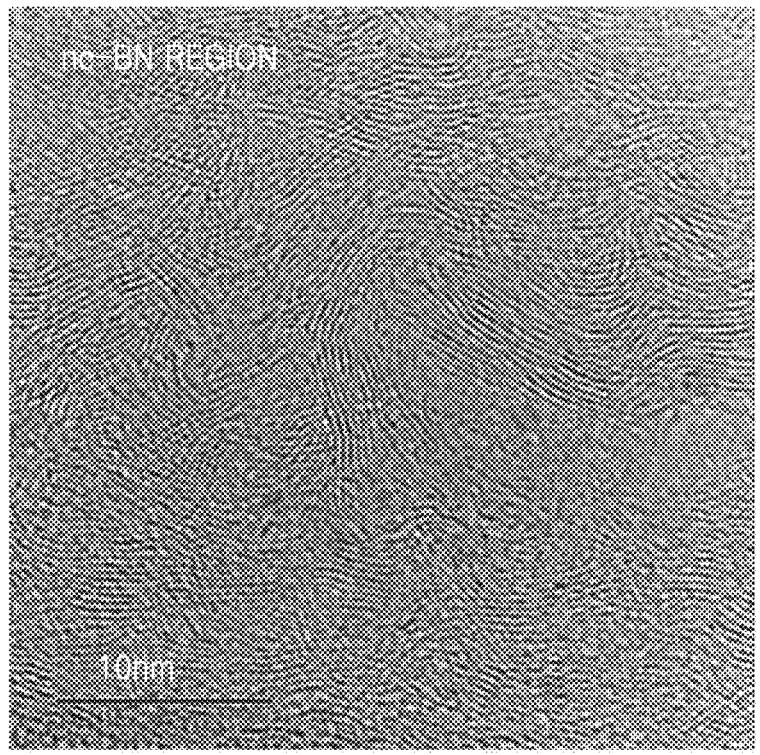
FIG. 6 is a high magnification image of the nanocrystalline boron nitride film of FIG. 5.

FIG. 5 is a TEM image of a nanocrystalline boron nitride film fabricated according to an embodiment. FIG. 6 is a high magnification image of the nanocrystalline boron nitride film of FIG. 5. Referring to FIGS. 5 and 6, it may be checked that the thickness of a nanocrystalline boron nitride film is 94 nm. Furthermore, it may be checked that a plurality of nanocrystalline boron nitride crystals are randomly oriented. The nanocrystalline boron nitride films of FIGS. 5 and 6 are formed under the process conditions of Embodiment 5 of FIG. 2. The dielectric constant and crystal size of the nanocrystalline boron nitride films of FIGS. 5 and 6 are about 3.9 and about 20 nm or less, respectively.

Figure 7:
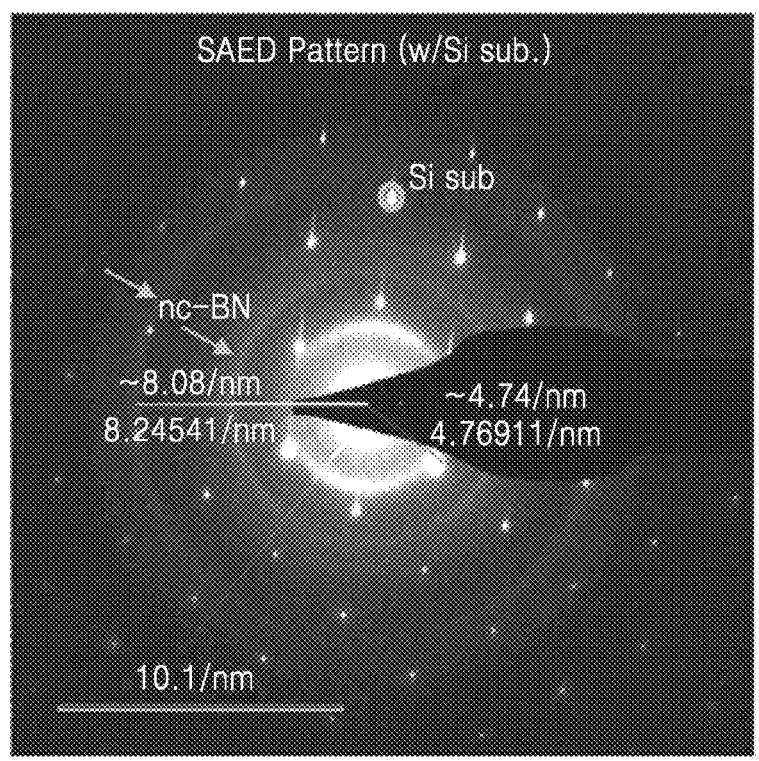
FIG. 7 is an image showing a diffraction pattern of the nanocrystalline boron nitride film of FIG. 5.

FIG. 7 is an image showing a diffraction pattern of the nanocrystalline boron nitride film of FIG. 5. In particular, FIG. 7 is an image showing a selected-area electron diffraction (SAED) pattern. In an SAED pattern, a pattern in the form of a plurality of spots may be formed by penetrating a silicon substrate. A pattern in the form of a vague ring is formed by a nanocrystalline boron nitride. A ring-shaped pattern may be formed by a plurality of crystals that are randomly oriented.

Figure 8:
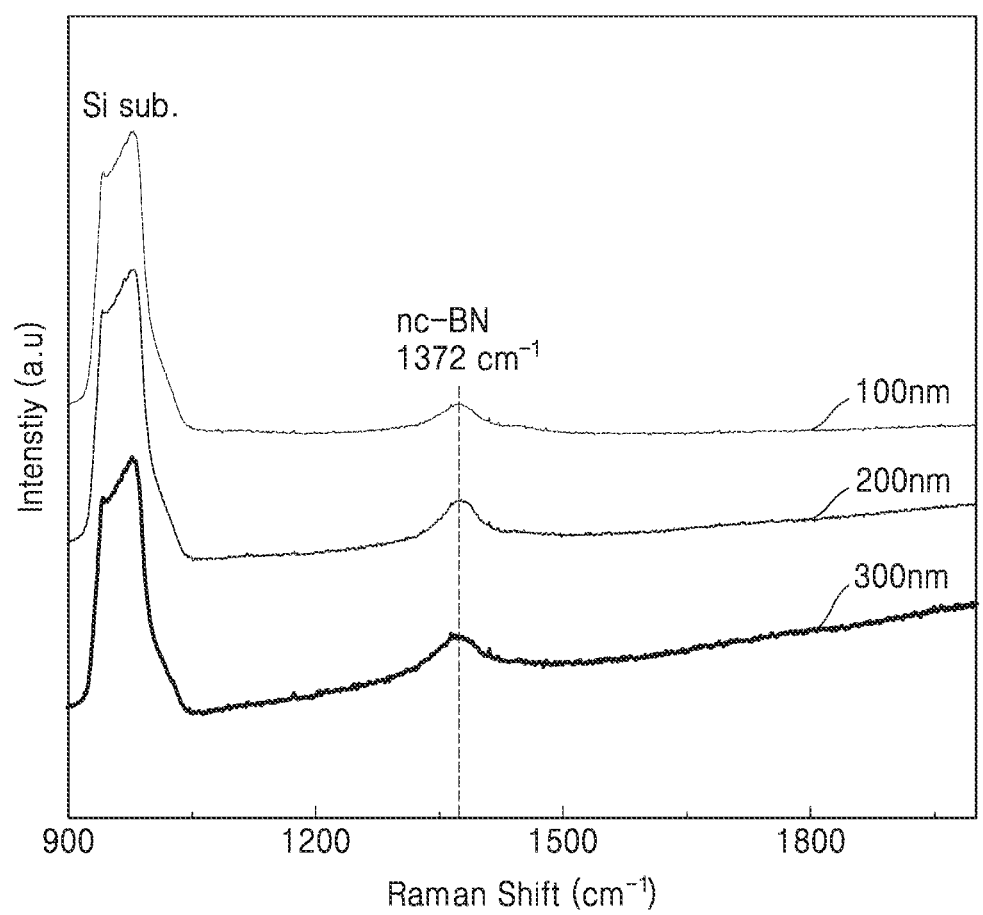
FIG. 8 is a graph showing a Raman spectrum of a nanocrystalline boron nitride film fabricated according to another embodiment.

FIG. 8 is a graph showing a Raman spectrum of a nanocrystalline boron nitride film fabricated according to another embodiment. In particular, FIG. 8 shows a Raman spectrum of a nanocrystalline boron nitride film formed under the process conditions of Embodiment 5 of FIG. 2. Referring to FIG. 8, it may be checked that a nanocrystalline boron nitride film has an absorption peak within a range of 1350 $cm^{-1}$ to 1380 $cm^{-1}$ of a Raman spectrum. An absorption peak formed within a range of 1350 $cm^{-1}$ to 1380 $cm^{-1}$ of a Raman spectrum, in particular an absorption peak formed around about 1372 $cm^{-1}$, may indicate the existence of an h-BN having an $sp^2$ bond.

Figure 9:
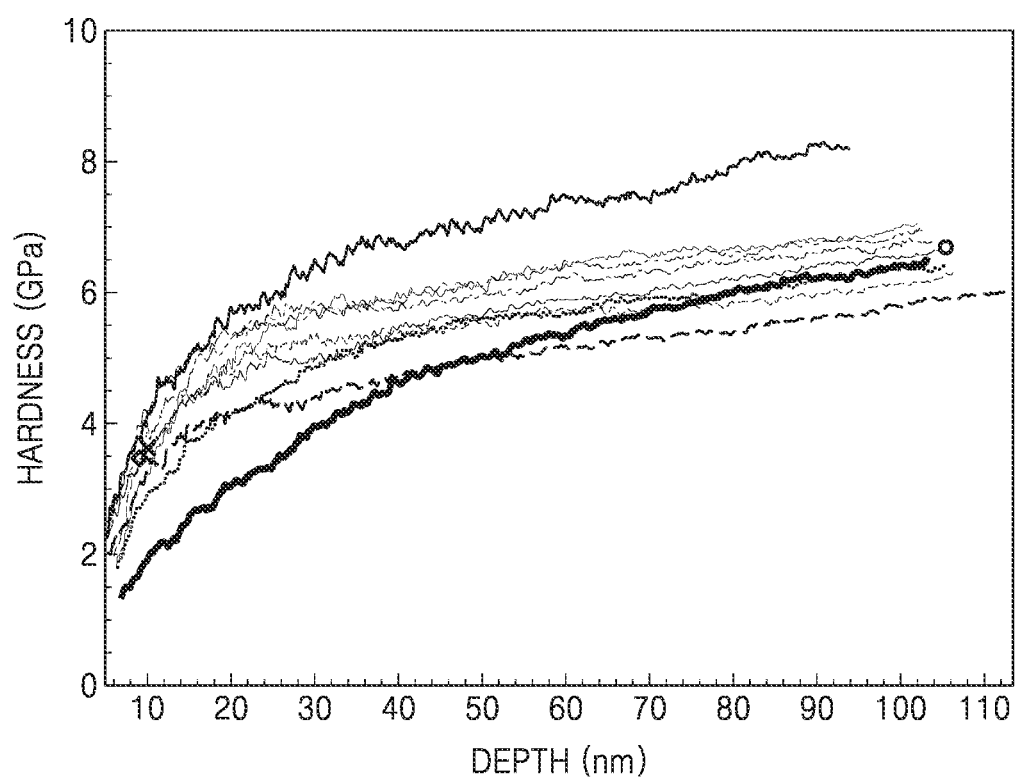
FIG. 9 is a graph showing a result of measuring the hardness of a nanocrystalline boron nitride film fabricated according to another embodiment.
Figure 10:
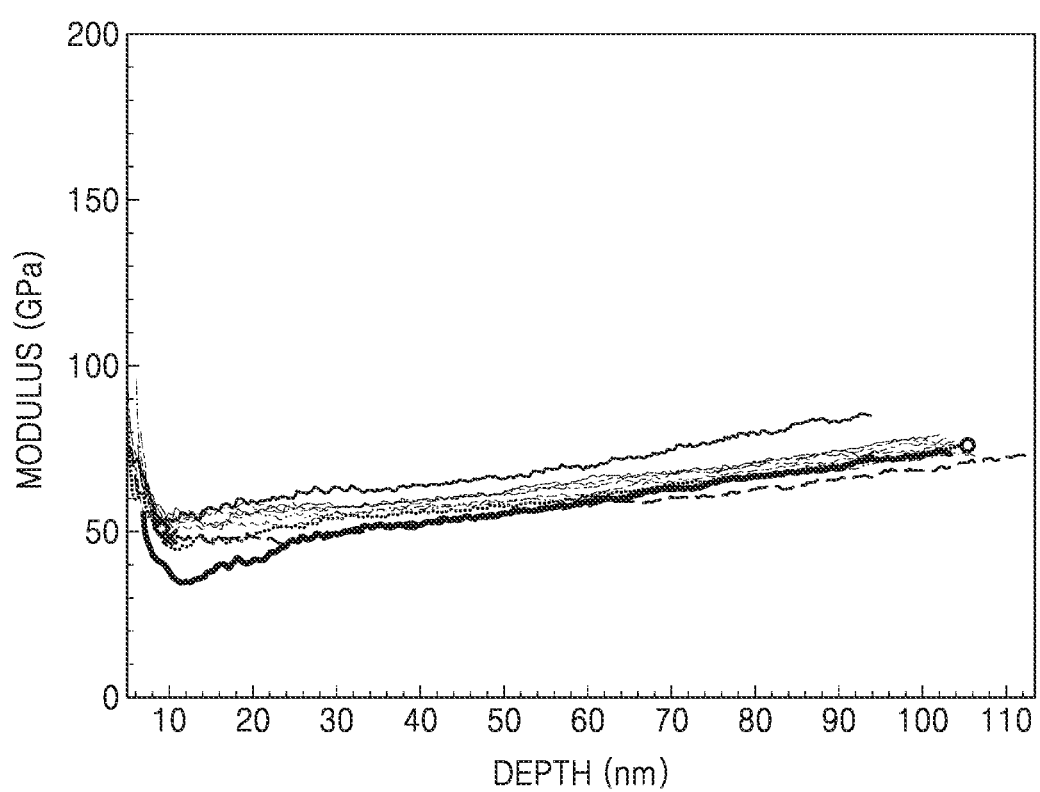
FIG. 10 is a graph showing a result of measuring the Young's modulus of a nanocrystalline boron nitride film fabricated according to another embodiment.

FIG. 9 is a graph showing a result of measuring the hardness of a nanocrystalline boron nitride film fabricated according to another embodiment. Furthermore, FIG. 10 is a graph showing a result of measuring the Young's modulus of a nanocrystalline boron nitride film fabricated according to another embodiment. In particular, FIGS. 9 and 10 are graphs showing results of measurement of hardness and Young's modulus of a nanocrystalline boron nitride film formed under the process conditions of Embodiment 5 of FIG. 2 by using a nanoindenter. Result values were measured by pressing a surface of a nanocrystalline boron nitride film having a 300 nm thickness to a depth, that is, 30 nm, of 10% of the thickness in a vertical direction by using a measurement tip. A hardness value and a Young's modulus value may be extracted by averaging the values measured at points at different positions on the surface of a nanocrystalline boron nitride film. Referring to FIG. 9, it may be checked that the nanocrystalline boron nitride film has a hardness in a range within about 3 GPa to about 7 GPa according to locations. Referring to FIG. 10, it may be checked that the nanocrystalline boron nitride film has a Young's modulus in a range within about 40 GPa to about 70 GPa according to locations.

Figures 11, 12:
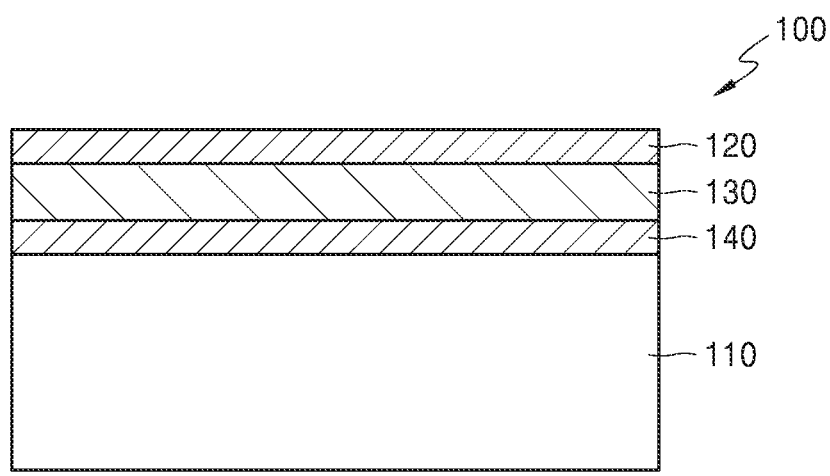
FIG. 11 is a table showing the physical properties of a nanocrystalline boron nitride film fabricated according to another embodiment.
FIG. 12 is a cross-sectional view schematically showing the structure of an antireflection coating structure according to an embodiment.

FIG. 11 is a table showing the physical properties of a nanocrystalline boron nitride film fabricated according to another embodiment. In FIG. 11, the dielectric constant, hardness, and Young's modulus were measured with respect to nanocrystalline boron nitride films having a 35 nm thickness, a 100 nm thickness, and a 300 nm thickness formed under the process conditions of Embodiment 5. Referring to FIG. 11, the dielectric constant, hardness, and Young's modulus of the nanocrystalline boron nitride film having a 300 nm thickness were measured to be about 5.5, about 3.309 GPa, and about 50.16 GPa, respectively, at a 100 kHz operating frequency. Furthermore, the dielectric constant, hardness, and Young's modulus of the nanocrystalline boron nitride film having a 100 nm thickness were measured to be about 3.9, about 2.465 GPa, and about 42.84 GPa, respectively, at a 100 kHz operating frequency. Furthermore, the dielectric constant of the nanocrystalline boron nitride film having a 35 nm thickness was measured to be about 3.5 at a 100 kHz operating frequency. When the thickness of a nanocrystalline boron nitride film is less than 100 nm, as an error increases due to the influence of a substrate, hardness and Young's modulus were not measured.

As may be seen from FIGS. 9 to 11, the dielectric constant, hardness, and Young's modulus of nanocrystalline boron nitride films according to some embodiments may vary depending on a thickness and/or process conditions, but the nanocrystalline boron nitride films may generally have a Young's modulus within a range of about 8 GPa to about 100 GPa, or about 10 GPa to about 60 GPa, a hardness within a range of about 1 GPa to about 10 GPa, or about 2 GPa to about 5 GPa, and a dielectric constant within a range of about 2.5 to about 5.5. Accordingly, the nanocrystalline boron nitride films according to some embodiments may have excellent mechanical physical properties while having a relatively low dielectric constant.

As described above, the nanocrystalline boron nitride films according to some embodiments exhibiting a relatively low dielectric constant and excellent mechanical physical properties may be applied to various electronic apparatuses. The nanocrystalline boron nitride films according to some embodiments may be used as interlayer insulating films, spacers, device separation films, and the like in the integrated circuits of various electronic apparatuses including, for example, image sensors, electric field effect transistors, memory devices, display devices, and the like Furthermore, the nanocrystalline boron nitride films may be used as antireflection films in display devices, optical devices, and the like.

FIG. 12 is a cross-sectional view schematically showing the structure of an antireflection coating structure 100 according to an embodiment. Referring to FIG. 12, the antireflection coating structure 100 may include a substrate 110, a nanocrystalline boron nitride film 120, and first and second material layers 130 and 140. The first and second material layers 130 and 140 may be provided between the substrate 110 and the nanocrystalline boron nitride film 120. In detail, the second material layer 140 may be provided on the upper surface of the substrate 110, and the first material layer 130 may be provided on the upper surface of the second material layer 140. The nanocrystalline boron nitride film 120 may be provided on the upper surface of the first material layer 130.

The first and second material layers 130 and 140 may include a material having a refractive index greater than the refractive index of the nanocrystalline boron nitride film 120. The first material layer 130 may include a material having a refractive index greater than the refractive index of the second material layer 140. For example, the first material layer 130 may include $ZrO_2$, and the second material layer 140 may include $CeF_3$, AlOx, or the like, but this is merely an example and the first and second material layers 130 and 140 may include various other materials.

The nanocrystalline boron nitride film 120 and the first and second material layers 130 and 140 may have a thickness that reduces reflectivity. For example, when the central wavelength of light incident on the antireflection coating structure 100 is $\lambda$, the nanocrystalline boron nitride film 120 is formed to a thickness of about $\lambda/4$, the first material layer 130 is formed to a thickness of about $\lambda/2$, and the second material layer 140 is formed to a thickness of about $\lambda/4$, thereby reducing reflectivity.

Figure 13:
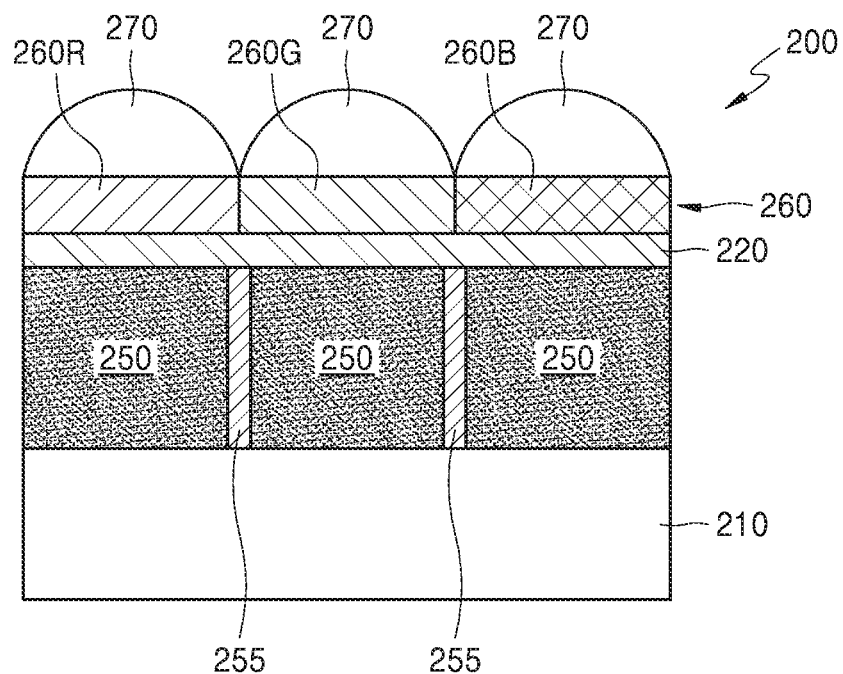
FIG. 13 is a cross-sectional view schematically showing the structure of an image sensor according to an embodiment.

FIG. 13 is a cross-sectional view schematically showing the structure of an image sensor 200 according to an embodiment. Referring to FIG. 13, the image sensor 200 may include a substrate 210, a plurality of photodiodes 250 provided on the substrate 210, a nanocrystalline boron nitride film 220 provided on the photodiodes 250, and a color filter layer 260 provided on the nanocrystalline boron nitride film 220.

The photodiodes 250 may be arranged in a two-dimensional array on the substrate 210. A black matrix 255 may be provided between the two adjacent photodiodes 250. The photodiodes 250 may convert incident light to electric energy, and a metal wiring (not shown) for detecting the electric energy generated from the photodiodes 250 may be provided on the substrate 210.

The color filter layer 260 may include a plurality of color filters provided respectively corresponding to the photodiodes 250. The color filters may include, for example, a red color filter 260R, a green color filter 260G, and a blue color filter 260B. However, the disclosure is not limited thereto. A plurality of micro lenses 270 respectively corresponding to the red, green, and blue color filters 260R, 260G, and 260B may be further provided on the color filter layer 260.

The nanocrystalline boron nitride film 220 may be provided between the color filter layer 260 and the photodiodes 250. The nanocrystalline boron nitride film 220 limits and/or prevents the reflection of light input through the color filter layer 260, and may have a low refractive index and a high hardness. As the nanocrystalline boron nitride film 220 is described above, a description thereof is omitted. As the nanocrystalline boron nitride film 220 described above is applied as an antireflection film to the image sensor 200, the light concentration ability of each of pixels may be improved, and furthermore, a light interference phenomenon occurring between pixels may be prevented.

Figure 14:
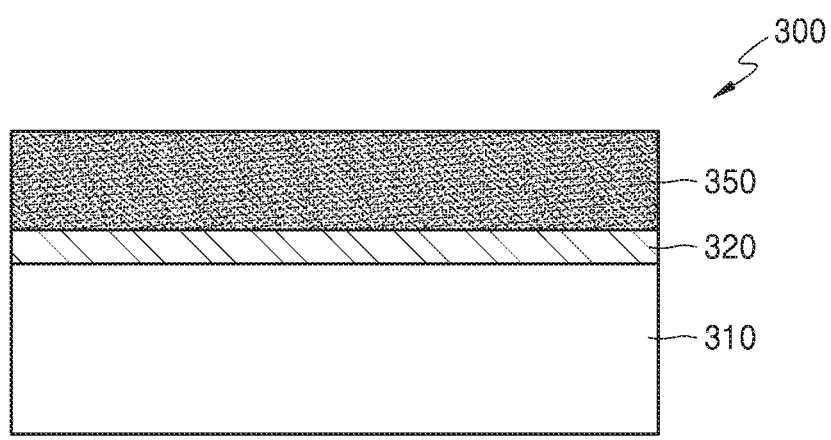
FIG. 14 is a cross-sectional view schematically showing the structure of a lithography device according to an embodiment.

FIG. 14 is a cross-sectional view schematically showing the structure of a lithography device 300 according to an embodiment. Referring to FIG. 14, the lithography device 300 may include a substrate 310, a photoresist layer 350 provided above the substrate 310, and a nanocrystalline boron nitride film 320 provided between the substrate 310 and the photoresist layer 350. The substrate 310 may be a structure to be patterned through a photolithography process.

The nanocrystalline boron nitride film 320 limits and/or prevents the reflection of light having passed through the photoresist layer 350. As the nanocrystalline boron nitride film 320 is described above, a description thereof is omitted. In the structure of FIG. 14, when light of a wavelength, for example, an ultraviolet ray, is incident on the photoresist layer 350 through a photomask (not shown), the nanocrystalline boron nitride film 320 may effectively limit and/or prevent the reflection of light having passed through the photoresist layer 350 so that the photoresist layer 350 may be accurately patterned to a desired shape. When the substrate 310 is etched by using the photoresist layer patterned as above as an etching mask, a structure in a desired shape may be implemented.

In an extreme ultraviolet (EUV) or deep ultraviolet (DUV) photolithography process for ultra-fine integration, as the size of a pattern decreases, line edge roughness (LER) or line width roughness (LWR) may be increased due to the light reflection of a substrate to be patterned. In the present embodiment, as the nanocrystalline boron nitride film 320 having a low dielectric constant and excellent mechanical physical properties is formed as an antireflection film between the substrate 310 and the photoresist layer 350, an ultra-fine pattern may be implemented uniformly and precisely.

Figure 15:
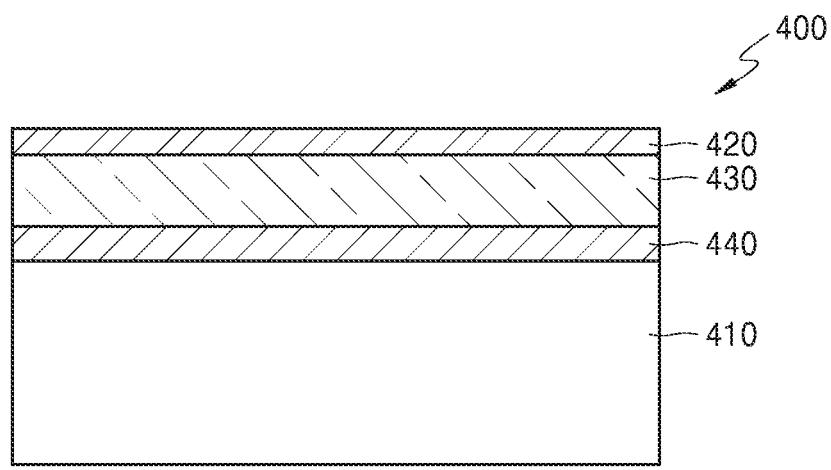
FIG. 15 is a cross-sectional view schematically showing the structure of a solar cell according to an embodiment.

FIG. 15 is a cross-sectional view schematically showing the structure of a solar cell 400 according to an embodiment. Referring to FIG. 15, the solar cell 400 may include a light absorption layer 410 and a nanocrystalline boron nitride film 420 provided on the light absorption layer 410. The light absorption layer 410 may include semiconductor materials (e.g., a pn junction including a first doping region and a second doping region of opposite conductivity types in the light-absorption layer) that absorb incident light to generate electric energy. Electrodes (not shown) may be connected to the light absorption layer 410 for collecting the electricity generated by the light absorption layer 410. A heat spreading layer 440 for dissipating heat generated from the light absorption layer 410 may be further provided between the light absorption layer 410 and the nanocrystalline boron nitride film 420, and a transparent substrate 430 may be further provided between the heat spreading layer 440 and the nanocrystalline boron nitride film 420.

The nanocrystalline boron nitride film 420 may improve the efficacy of the solar cell 400 by limiting and/or preventing the reflection of incident light. As the nanocrystalline boron nitride film 420 is described above, a description thereof is omitted. As such, by forming the nanocrystalline boron nitride film 420 on the solar cell 400, the light incident on the light absorption layer 410 may be increased, and light loss due to reflected light may be reduced.

Figure 16:
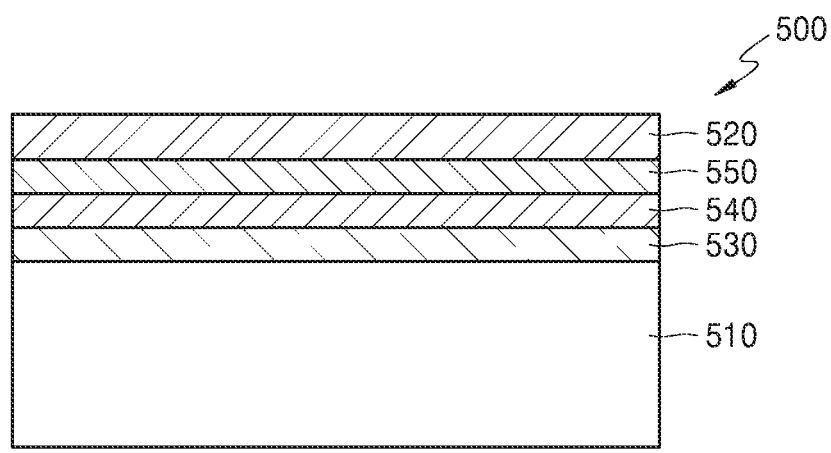
FIG. 16 is a cross-sectional view schematically showing the structure of a display device according to an embodiment.

FIG. 16 is a cross-sectional view schematically showing the structure of a display device 500 according to an embodiment. Referring to FIG. 16, the display device 500 may include a display panel 510 and a nanocrystalline boron nitride film 520 provided on the display panel 510. The display panel 510 may include, for example, a liquid crystal display panel or an organic light-emitting display panel, and the like, but the disclosure is not limited thereto.

A transparent substrate 530 may be provided on the upper surface of the display panel 510, and a polarization plate 540 for improving a viewing angle may be provided on the upper surface of the transparent substrate 530. Furthermore, a protection film 550 may be further provided on the upper surface of the polarization plate 540. The nanocrystalline boron nitride film 520 may be provided as an antireflection film on the upper surface of the protection film 550. As the nanocrystalline boron nitride film 520 is described above, a description thereof is omitted. The protection film 550 may include a material having a higher dielectric constant than the dielectric constant of the nanocrystalline boron nitride film 520. As such, as the nanocrystalline boron nitride film 520 serving as an antireflection film is provided on the display panel 510, reflected light coming into the eyes of a viewer seeing the display device 500 may be reduced.

Figure 17:
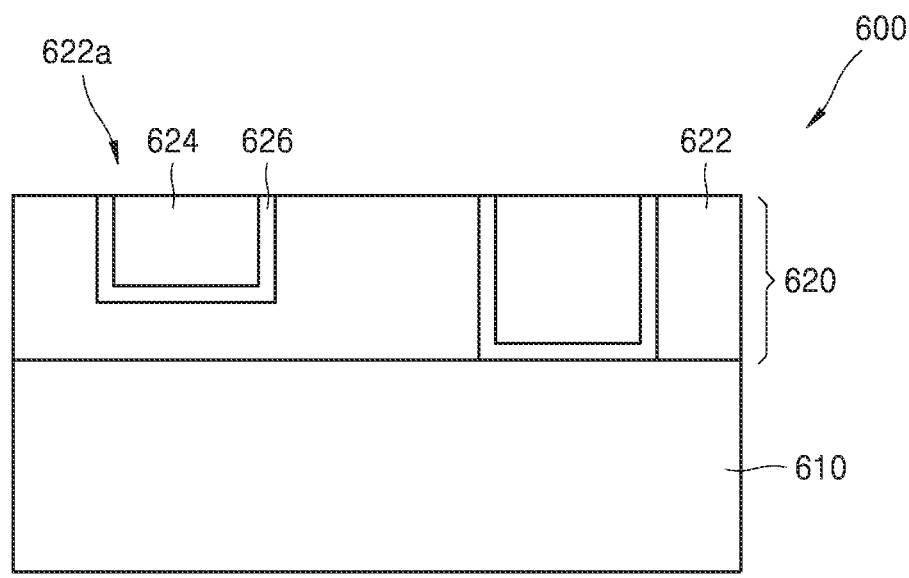
FIG. 17 is a cross-sectional view schematically showing the structure of a semiconductor device including a wiring structure according to an embodiment.

FIG. 17 is a cross-sectional view schematically showing the structure of a semiconductor device 600 including a wiring structure according to an embodiment. Referring to FIG. 17, the semiconductor device 600 may include a substrate 610 and a wiring structure 620 provided on the substrate 610. The wiring structure 620 may include a dielectric layer 622, a conductive wiring 624, and a diffusion barrier layer 626.

The substrate 610 may include a semiconductor substrate. For example, the substrate 610 may include a group IV semiconductor material, a group III-V compound semiconductor material, or a group I-VI compound semiconductor material. For example, the substrate 610 may include at least one of semiconductor materials, such as Si, Ge, SiC, SiGe, SiGeC, Ge Alloy, GaAs, InAs, and InP. However, this is merely an example, and various other semiconductor materials may be used as the substrate 610. Furthermore, the substrate 610 may include a single layer or a plurality of layers on which different materials are stacked. For example, the substrate 610 may include a silicon-on-insulator (SOI)

substrate or a silicon germanium-on-insulator (SGOI) substrate. Furthermore, the substrate 610 may include at least one semiconductor device (not shown). The semiconductor device may include at least one of, for example, a transistor, a capacitor, a diode, and a resistor.

The dielectric layer 622 is formed on the substrate 610. The dielectric layer 622 may have a single layer structure or a multilayer structure in which different dielectric materials are stacked. The dielectric layer 622 may include a dielectric material used in a general semiconductor manufacturing process. For example, the dielectric layer 622 may include a silicon oxide, a silicon nitride, silicate, and the like. However, this is merely an example, and various other dielectric materials may be used as the dielectric layer 622. Furthermore, the dielectric layer 622 may include a SiCOH-based organic/inorganic hybrid dielectric material. Furthermore, the dielectric layer 622 may include nanocrystalline boron nitride films according to some embodiments. When the dielectric layer 622 includes a nanocrystalline boron nitride film, the dielectric layer 622 may perform a function of the diffusion barrier layer 626 described below. In this case, the diffusion barrier layer 626 described below may be omitted.

At least one trench 622a may be formed in the dielectric layer 622 to a depth. The at least one trench 622a may be formed not to contact the substrate 610 or to contact the substrate 610. FIG. 17 illustrates a case in which two trenches 622a are formed in the dielectric layer 622, and one of the trenches 622a is formed not to contact the substrate 610 while the other of the trenches 622a is formed to contact the substrate 610.

The conductive wiring 624 is provided to fill the inside of the trench 622a. The conductive wiring 624 may include a metal or metal alloy having excellent conductivity. For example, the conductive wiring 624 may include Cu, Ru, Al, Co, W, Mo, Ti, Ta, Ni, Pt, Cr, Rh, Ir, or an alloy thereof. However, the disclosure is not limited thereto, and various other metals may be used as the conductive wiring 624.

The diffusion barrier layer 626 is provided on the inner wall of the trench 622a. The diffusion barrier layer 626 may be provided to cover the conductive wiring 624 between the dielectric layer 622 and the conductive wiring 624. In detail, the diffusion barrier layer 626 may be provided on the inner wall of the trench 622a to cover the side surface and the lower surface of the conductive wiring 624. The upper surface of the conductive wiring 624 may be exposed by the diffusion barrier layer 626. The diffusion barrier layer 626 may limit and/or prevent diffusion of a material forming the conductive wiring 624. The diffusion barrier layer 626 may additionally function as an adhesive layer between the dielectric layer 622 and the conductive wiring 624. The diffusion barrier layer 626 may include nanocrystalline boron nitride films according to some embodiments.

Figure 18:
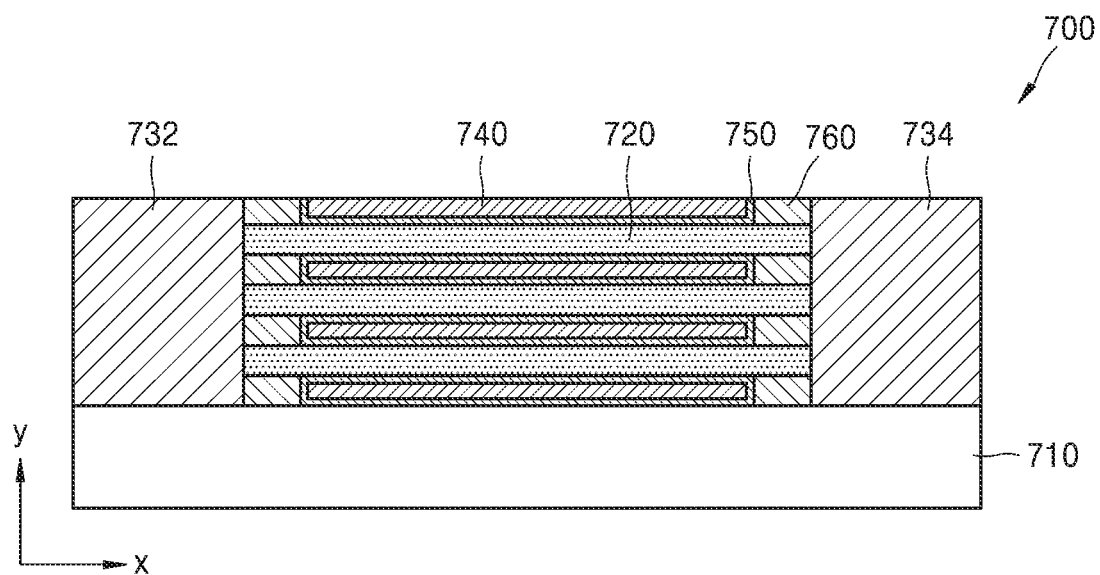
FIG. 18 is a cross-sectional view schematically showing the structure of an electric field effect transistor according to an embodiment.

FIG. 18 is a cross-sectional view schematically showing the structure of an electric field effect transistor 700 according to an embodiment. Referring to FIG. 18, the electric field effect transistor 700 may include a substrate 710, a plurality of channels 720 provided above the substrate 710, a source 732 and a drain 734, each being in contact with the channels 720, and a plurality of gates 740 respectively arranged apart from the channels 720. The source 732 and the drain 734 may be arranged apart from each other in a first direction, that is, an X direction, and the channels 720 may be arranged apart from each other between the source 732 and the drain 734 in a second direction, that is, a Y direction.

The gates 740 may be arranged to face each other and apart from each of the channels 720, and a gate insulating film 750 may be disposed between each two of the gates 740 and the channels 720. For example, the gate insulating film 750 may be provided to encompass at least a portion of each of the gates 740. For example, the gates 740 and the channels 720 may be alternately arranged in the second direction, and the gate insulating film 750 may be in the form of surrounding the gates 740. The gate insulating film 750 may insulate between the channels 720 and the gates 740, and restrict a leakage current occurrence.

A contact between each of the channels 720 and the source 732 and a contact between each of the channels 720 and the drain 734 may have an edge contact shape. For example, both ends of the channels 720 may be respectively in contact with the source 732 and the drain 734.

Each of the gates 740 may be arranged apart from the source 732 and the drain 734, and a spacer 760 may be further disposed between each of the gates 740 and the source 732, and between each of the gates 740 and the drain 734. As the source 732, the gates 740, and the drain 734 are arranged in the first direction, a parasitic capacitance may be generated between the source 732 and the gates 740, and between the gates 740 and the drain 734.

To reduce the parasitic capacitance, the spacer 760 may include nanocrystalline boron nitride films according to some embodiments. The nanocrystalline boron nitride films according to some embodiments have a relatively low dielectric constant of about 2.5 to about 5.5 at a 100 kHz operating frequency, and thus, parasitic capacitance may be effectively reduced. Furthermore, as the nanocrystalline boron nitride films according to some embodiments have excellent mechanical physical properties, the spacer 760 may support the channels 720 disposed thereabove.

The electric field effect transistor 700 may have a multi-bridge shape in which each of the channels 720 has both ends in contact with the source 732 and the drain 734 and the channels 720 are stacked apart from each other in a direction away from the substrate 710. The channels 720 having a multi-bridge shape may reduce a short channel effect and decrease an area occupied by the source/drain, and thus, it is advantageous for high integration. Furthermore, as a uniform source/drain junction capacitance may be maintained regardless of the position of a channel, the electric field effect transistor 700 may be employed as a high speed and high reliable device.

The gate insulating film 750 may include a dielectric material having a relatively high dielectric constant. The gate insulating film 750 may include, for example, an aluminum oxide, a hafnium oxide, a zirconium hafnium oxide, a lanthanum oxide, and the like. However, the disclosure is not limited thereto. Alternatively, the gate insulating film 750 may include a ferroelectric material. When the gate insulating film 750 includes a ferroelectric material, the electric field effect transistor 700 may be employed as, for example, a logic device, a memory device, or the like. Alternatively, the gate insulating film 750 may have a dual-layer structure including a high dielectric constant material and a ferroelectric material.

Figure 19:
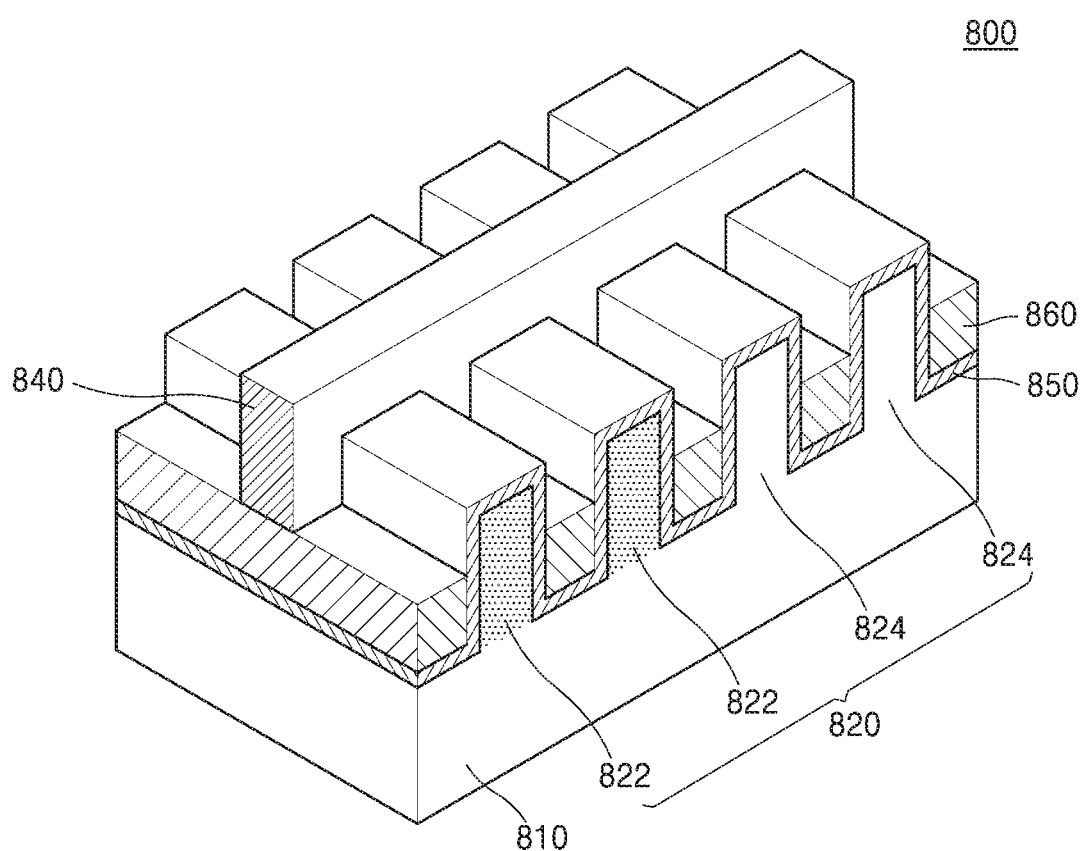
FIG. 19 is a perspective view schematically showing the structure of an electric field effect transistor according to another embodiment.

FIG. 19 is a perspective view schematically showing the structure of an electric field effect transistor 800 according to another embodiment. Referring to FIG. 19, the electric field effect transistor 800 is a FinFET having a fin structure protruding on a substrate 810. The electric field effect transistor 800 may have a sufficient channel length because fin structures, for example, active fins 822 and dummy fins 824, are used as a channel 820. Accordingly, the short channel effect may be prevented or reduced, and the leakage current occurrence may be reduced.

The electric field effect transistor 800 may include the substrate 810, the active fin 822, the dummy fin 824, a gate 840, a gate insulating film 850, and a spacer 860. Although not illustrated, both ends of the active fin 822 are respectively and electrically connected to the source and the drain. Although two active fins 822 are illustrated as channels, the number of active fins 822 is not limited thereto. The active fin 822 and the dummy fin 824 may be connected to the substrate 810. In an embodiment, the active fin 822 may be an active area obtained by doping a portion vertically protruding from the substrate 810 to n+ or p+, whereas the dummy fin 824 may be an undoped portion of the portion vertically protruding from the substrate 810. In another embodiment, both of the active fin 822 and the dummy fin 824 may be active areas doped to n+ or p+. Each active fin 822 may have a width and a height, and the widths and heights of the active fins 822 may determine the width and height of the channel 820. The width and height of the channel 820 may be increased by the number of active fins 822.

The gate insulating film 850 may be disposed on the active fin 822 and the dummy fin 824. The gate insulating film 850 may include any one of an oxide film, a nitride film, and an oxynitride film.

The spacer 860 may be disposed to have a height in a space between the active fin 822 and the dummy fin 824. The spacer 860 may include nanocrystalline boron nitride films according to some embodiments. As the spacer 860 is disposed between the active fin 822 and the dummy fin 824, not only the spacer 860 may be used as a device separation film, but also the spacer 860 may reduce parasitic capacitance.

The gate 840 may be disposed above the gate insulating film 850 and the spacer 860. The gate 840 may have a structure surrounding the active fin 822, the dummy fin 824, and the spacer 860. In other words, the active fin 822 and the dummy fin 824 may have a structure disposed inside the gate 840.

Figure 20:
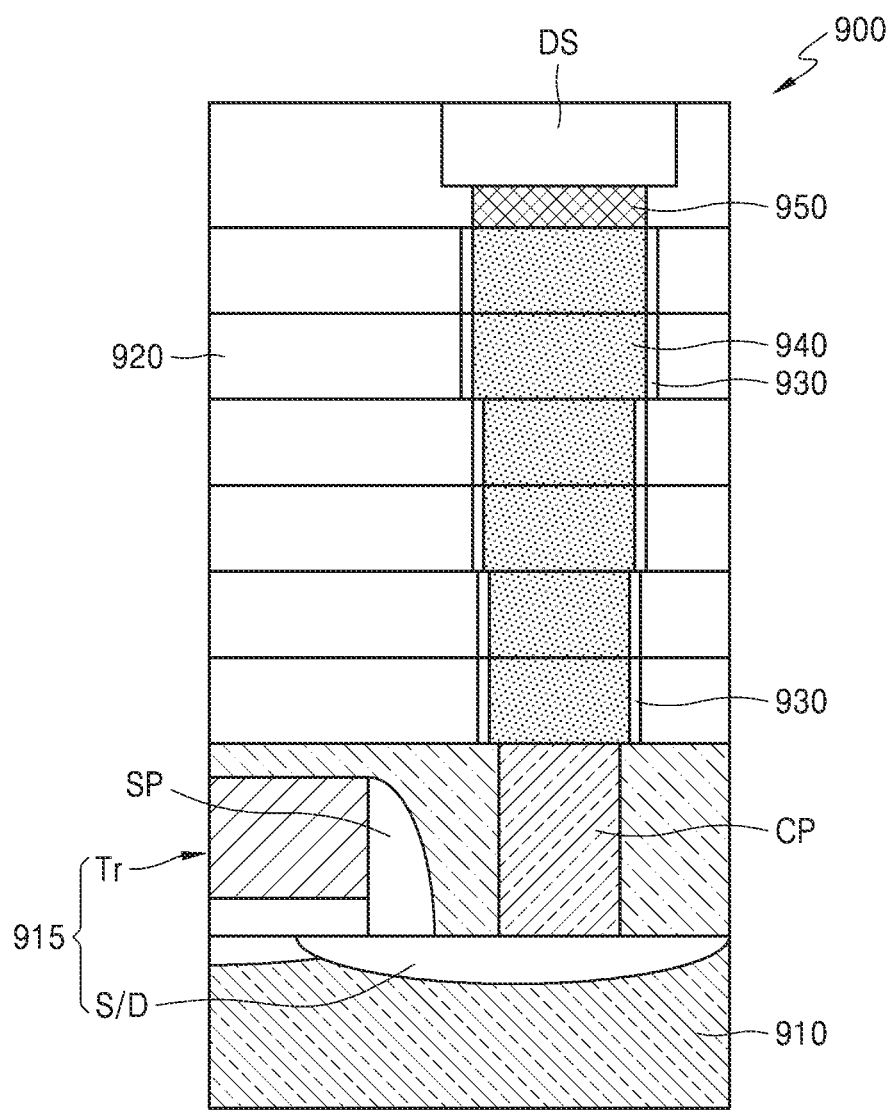
FIG. 20 is a cross-sectional view of a memory device according to an embodiment.

FIG. 20 is a cross-sectional view of a memory device according to an embodiment.

Referring to FIG. 20, in a memory device 900 according to an embodiment, a substrate 910 may include a source/drain region S/D formed by doping an impurity into a region of the substrate 910.

A device element 915 on the substrate 910 may include a transistor Tr that includes the source/drain region S/D. A dielectric layer 920 may be formed on the device element 915 and substrate 910. A conductive line 940 may be formed in the dielectric layer 920 and may extend through the dielectric layer 920 in a vertical direction. A data storage structure DS, such as a capacitor, may be formed on the conductive line 940. Another dielectric layer 920 may be formed on the dielectric layer 920 and surround the data storage structure DS. A cap layer 950 may be formed on an upper surface of the conductive line 940. The cap layer 950 may include graphene, but example embodiments are not limited thereto. Barrier layers 930 may be provided between the dielectric layer 120g and the conductive line 940. The barrier layers 930 may include a nanocrystalline boron nitride film according to some embodiments.

Figure 21:
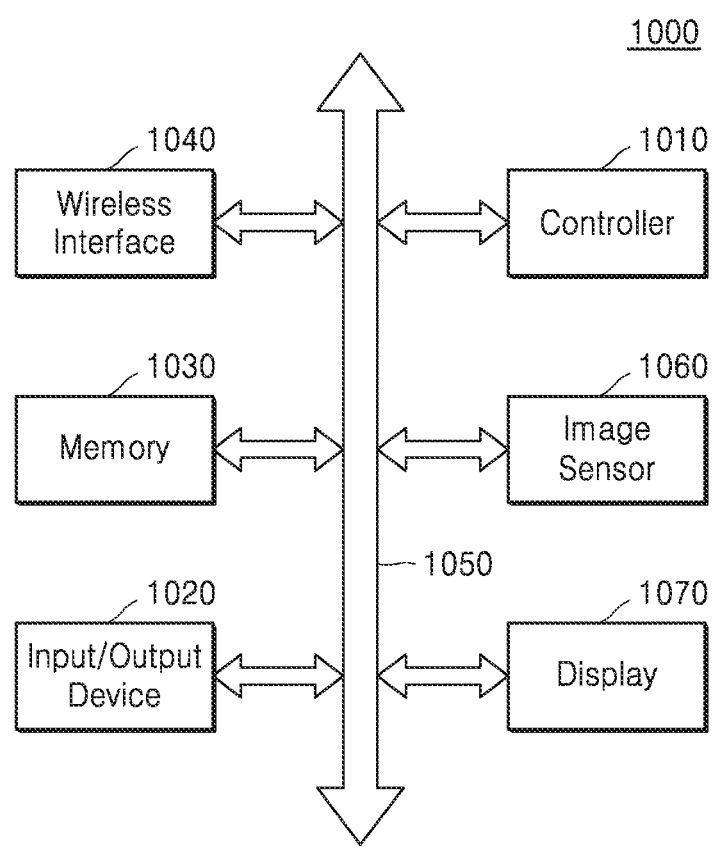
FIG. 21 is a block diagram of an electronic device according to an embodiment.

FIG. 21 is a block diagram of an electronic device according to an embodiment.

FIG. 21 is a block diagram of an electronic device 1000 according to an embodiment. Referring to FIG. 21, the electronic device 1000 may constitute a wireless communication device or a device capable of transmitting and/or receiving information in a wireless environment. The electronic device 1000 may include a controller 1010, an input/output device (I/O) 1020, a memory 1030, and a wireless interface 1040, and these components are interconnected to each other through a bus 1050. Optionally, the electronic device 1000 may further include an image sensor 1060 and/or a display 1070 connected to the bus 1050.

The controller 1010 may include at least one of a microprocessor, a digital signal processor, and a processing device similar thereto. The I/O device 1020 may include at least one of a keypad, a keyboard, and a display. The memory 1030 may be used to store instructions executed by controller 1010. For example, the memory 1030 may be used to store user data. The electronic device 1000 may use the wireless interface 1040 to transmit/receive data through a wireless communication network. The wireless interface 1040 may include an antenna and/or a wireless transceiver. In some embodiments, the electronic device 1000 may be used in a communication interface protocol of a third-generation communication system such as code division multiple access (CDMA), global system for mobile communications (GSM), north American digital cellular (NADC), extended-time division multiple access (E-TDMA), wide band code division multiple access (WCDMA), a 4G (4th Generation) communication system such as 4G LTE, a 5G (5th Generation) communication system, a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), and/or Power Line communication (PLC).

The electronic device 1000 may include the nanocrystalline boron nitride film according to FIG. 1C and/or a semiconductor structure including the same. For example, the controller 1010, I/O device 1020, and/or memory 1030 may include the semiconductor device 600 according to FIG. 17 and/or transistor 700 according to FIG. 18 of the present application. The memory 1030 may include the memory device 900 according to FIG. 20 of the present application. The image sensor 1060 may include the image sensor 200 according to FIG. 13 of the present application. The display 1070 may include the display device 500 according to FIG. 16 of the present application. However, example embodiments are not limited thereto.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that the presented embodiments, including the semiconductor device including a junction of met-l—two-dimensional material—semiconductor, described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A nanocrystalline boron nitride film comprising:
a plurality of nanocrystalline boron nitride crystals having a size within a range of 5 nm to 100 nm,
wherein the nanocrystalline boron nitride film has a dielectric constant within a range of 2.5 to 5.5 at a 100 kHz operating frequency, and
wherein the nanocrystalline boron nitride film has a hardness of 1 GPa to 10 GPa.

2. The nanocrystalline boron nitride film of claim 1, wherein the plurality of nanocrystalline boron nitride crystals are randomly oriented.

3. The nanocrystalline boron nitride film of claim 1, wherein the nanocrystalline boron nitride film has a Young's modulus of 8 GPa to 100 GPa.

4. The nanocrystalline boron nitride film of claim 1, wherein the nanocrystalline boron nitride film has a Young's modulus of 10 GPa to 60 GPa.

5. The nanocrystalline boron nitride film of claim 1, wherein the nanocrystalline boron nitride film has a hardness of 2 GPa to 5 GPa.

6. The nanocrystalline boron nitride film of claim 1, wherein the nanocrystalline boron nitride film has an absorption peak within a range of 1350 $cm^{-1}$ to 1380 $cm^{-1}$ of a Raman spectrum.

7. The nanocrystalline boron nitride film of claim 1, wherein
the boron nitride film includes a $sp^3$ hybridized bond and a $sp^2$ hybridized bond, and
a ratio of the $sp^3$ hybridized bond in the nanocrystalline boron nitride film is less than 20%.

8. The nanocrystalline boron nitride film of claim 1, wherein a hydrogen content in the nanocrystalline boron nitride film is less than 10 at %.

9. An image sensor comprising:
a substrate;
a plurality of photodiodes on the substrate; and
a nanocrystalline boron nitride film on the plurality of photodiodes, wherein
the nanocrystalline boron nitride film includes a plurality of nanocrystalline boron nitride crystals having a size within a range of 5 nm to 100 nm,
the nanocrystalline boron nitride film has a dielectric constant within a range of 2.5 to 5.5 at a 100 kHz operating frequency, and
the nanocrystalline boron nitride film has a hardness of 1 GPa to 10 GPa.

10. The image sensor of claim 9, wherein the plurality of nanocrystalline boron nitride crystals are randomly oriented.

11. The image sensor of claim 9, wherein the nanocrystalline boron nitride film has a Young's modulus of 8 GPa to 100 GPa.

12. The image sensor of claim 9, wherein the nanocrystalline boron nitride film has an absorption peak within a range of 1350 $cm^{-1}$ to 1380 $cm^{-1}$ of a Raman spectrum.

13. An electric field effect transistor comprising:
a source;
a drain;
a channel between the source and the drain;
a gate facing the channel;
a gate insulating film between the gate and the channel; and
a spacer between the source and the gate and between the drain and the gate, wherein
the spacer includes a nanocrystalline boron nitride film, the nanocrystalline boron nitride film including a plurality of nanocrystalline boron nitride crystals having a size within a range of 5 nm to 100 nm,
the nanocrystalline boron nitride film has a dielectric constant within a range of 2.5 to 5.5 at a 100 kHz operating frequency, and
the nanocrystalline boron nitride film has a hardness of 1 GPa to 10 GPa.

14. The electric field effect transistor of claim 13, wherein the plurality of nanocrystalline boron nitride crystals are randomly oriented.

15. The electric field effect transistor of claim 13, wherein the nanocrystalline boron nitride film has a Young's modulus of 8 GPa to 100 GPa.

16. The electric field effect transistor of claim 13, wherein the nanocrystalline boron nitride film has an absorption peak within a range of 1350 $cm^{-1}$ to 1380 $cm^{-1}$ of a Raman spectrum.

* * * * *